United States Patent
Miyano

(10) Patent No.: US 8,482,326 B2
(45) Date of Patent: Jul. 9, 2013

(54) DLL CIRCUIT, SEMICONDUCTOR DEVICE INCLUDING THE SAME, AND DATA PROCESSING SYSTEM

(75) Inventor: Kazutaka Miyano, Chuo-ku (JP)

(73) Assignee: Elpida Memory, Inc., Tokyo (JP)

(*) Notice: Subject to any disclaimer, the term of this patent is extended or adjusted under 35 U.S.C. 154(b) by 557 days.

(21) Appl. No.: 12/646,548

(22) Filed: Dec. 23, 2009

(65) Prior Publication Data

US 2010/0156489 A1    Jun. 24, 2010

(30) Foreign Application Priority Data

Dec. 24, 2008    (JP) .................................. 2008-327611

(51) Int. Cl.
*H03L 7/06* (2006.01)

(52) U.S. Cl.
USPC .......................................... 327/158; 327/156

(58) Field of Classification Search
USPC .................................................. 327/156, 158
See application file for complete search history.

(56) References Cited

U.S. PATENT DOCUMENTS

| 7,388,415 B2 * | 6/2008 | Lee | 327/158 |
| 2007/0210843 A1 * | 9/2007 | Takai | 327/158 |
| 2009/0039930 A1 * | 2/2009 | Kuroki et al. | 327/158 |

FOREIGN PATENT DOCUMENTS

JP    2007-243735 A    9/2007

* cited by examiner

*Primary Examiner* — Lincoln Donovan
*Assistant Examiner* — Diana J Cheng
(74) *Attorney, Agent, or Firm* — Sughrue Mion, PLLC

(57) ABSTRACT

To provide a DLL circuit including: a first phase determination circuit that compares phases of rising edges of an external clock and a first internal clock; a second phase determination circuit that compares phases of falling edges of the external clock and the first internal clock; an adjusting unit that adjusts positions of active edges of internal clocks based on determination results; and a control circuit that sets one of adjustment amounts of the second and third internal clocks to a larger value than the other, in response to a fact that adjustment directions of the active edges of the second and third internal clocks are mutually the same. With this arrangement, a duty can be set nearer to 50% while performing phase adjustment. Accordingly, the time required to lock the DLL circuit can be shortened.

7 Claims, 6 Drawing Sheets

DLL CIRCUIT, SEMICONDUCTOR DEVICE INCLUDING THE SAME, AND DATA PROCESSING SYSTEM

BACKGROUND OF THE INVENTION

1. Field of the Invention

The present invention relates to a DLL (Delay Locked Loop) circuit and a semiconductor device including the same, and more particularly relates to a DLL circuit that can be locked in a short time and a semiconductor device including the same. The present invention also relates to a data processing system including the semiconductor device.

2. Description of Related Art

In recent years, a synchronous memory that operates synchronously with a clock has been widely used as a main memory of a personal computer or the like. Particularly, a DDR (Double Data Rate) synchronous memory requires input/output data to be accurately synchronized with an external clock. Therefore, it is essential to provide a DLL circuit to generate an internal clock synchronous with an external clock. Japanese Patent Application Laid-open No. 2007-243735 discloses an example of such a DLL circuit.

The DLL circuit has a function of adjusting a position of a rising edge of an internal clock, and a function of adjusting a position of a falling edge of the internal clock, thereby matching a phase of the external clock with that of the internal clock. The rising edge of the internal clock is regulated by a rise clock generated within the DLL circuit, and the falling edge of the internal clock is regulated by a fall clock generated within the DLL circuit.

When the rising edge of the internal clock is advanced relative to the rising edge of the external clock, an active edge of the rise clock is delayed by one pitch. On the other hand, when the rising edge of the internal clock is delayed relative to the rising edge of the external clock, the active edge of the rise clock is advanced by one pitch. Similarly, when the falling edge of the internal clock is advanced relative to the falling edge of the external clock, an active edge of the fall clock is delayed by one pitch. On the other hand, when the falling edge of the internal clock is delayed relative to the falling edge of the external clock, the active edge of the fall clock is advanced by one pitch.

However, when an adjustment direction of the rise clock and an adjustment direction of the fall clock are the same, that is, when the active edges of both clocks are delayed by one pitch, or when the active edges of both clocks are advanced by one pitch, a duty does not change as compared with that before the adjustment, although phases are adjusted to a direction to which the internal clock and the external clock come closer. Therefore, the number of steps necessary to adjust thereafter the duty of the internal clock increases. As a result, the time required to lock the DLL circuit becomes long.

SUMMARY

The present invention seeks to solve one or more of the above problems, or to improve upon those problems at least in part.

In one embodiment of the present invention, there is provided a DLL circuit comprising: a first phase determination circuit that compares a phase between a rising edge of a first clock signal and a rising edge of a second clock signal to generate a first determination signal; a second phase determination circuit that compares a phase between a falling edge of the first clock signal and a falling edge of the second clock signal to generate a second determination signal; a first adjustment circuit that adjusts a position of an active edge of a third clock signal based on the first determination signal; a second adjustment circuit that adjusts a position of an active edge of a fourth clock signal based on the second determination signal; a clock generating circuit that generates the second clock signal based on the third and fourth clock signals; and a control circuit that sets one of adjustment amounts by the first and second adjustment circuits to a larger value than the other, in response to a fact that an adjustment direction of the active edge of the third clock signal based on the first determination signal and an adjustment direction of the active edge of the fourth clock signal based on the second determination signal are mutually same.

According to the embodiment of the present invention, when the adjustment directions of the third clock and the fourth clocks are the same, an adjustment amount of one of the clocks is set larger than that of the other clock. Therefore, the duty changes as compared with that before the adjustment. Consequently, the number of steps necessary to adjust thereafter the duty of the internal clock becomes small. Accordingly, the time required to lock the DLL circuit can be reduced.

A change of the duty achieved in the present invention has a possibility of becoming far from a correct duty (=50%). However, this case occurs mainly in a state that phases of the internal clock and the external clock are still much further from each other. When the phase of the internal clock comes nearer to the phase of the external clock, the possibility of the above case is decreased, and when both phases substantially coincide with each other, the duty becomes approximately 50%. When the second phase determination circuit compares the falling edge of the first clock with the falling edge of the second clock by detecting the duty of the second clock, the change of the duty obtained in the present invention is directed toward the correct duty (=50%) in most cases. Therefore, in the present invention, very preferably, the second phase determination circuit compares a phase of the falling edge of the first clock with that of the second clock by detecting the duty of the second clock.

In the embodiment of the present invention, preferably, the control circuit stops one of the adjusting operation of the first adjustment circuit and the adjusting operation of the second adjustment circuit, in response to a fact that the adjustment direction of the active edge of the third clock based on the first determination signal and the adjustment direction of the active edge of the fourth clock based on the second determination signal are mutually opposite.

According to the embodiment of the present invention, when the adjustment direction of the rising edge and the adjustment direction of the falling edge are mutually opposite, either the adjusting operation of the rising edge or the adjusting operation of the falling edge is stopped. Therefore, a phenomenon that a clock width changes greatly at a time can be prevented. Consequently, even when a clock frequency is high, a risk of losing a pulse can be reduced.

As described above, according to the embodiment of the present invention, when the adjustment direction of the rising edge and the adjustment direction of the falling edge are the same, an adjustment amount of one of the edges is set larger than that of the other. Therefore, the duty can be set nearer to 50% while performing pulse adjustment. Consequently, the time required to lock the DLL circuit can be reduced.

Further, when a condition of greatly changing a clock width at a time is detected, pulse loss does not easily occur even when a clock frequency is high, by stopping the adjusting operation of the rising edge or that of the falling edge.

Therefore, the DLL circuit is preferably incorporated in a semiconductor device that performs data input/output synchronously with a high-speed clock, and particularly preferably incorporated in a DRAM.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
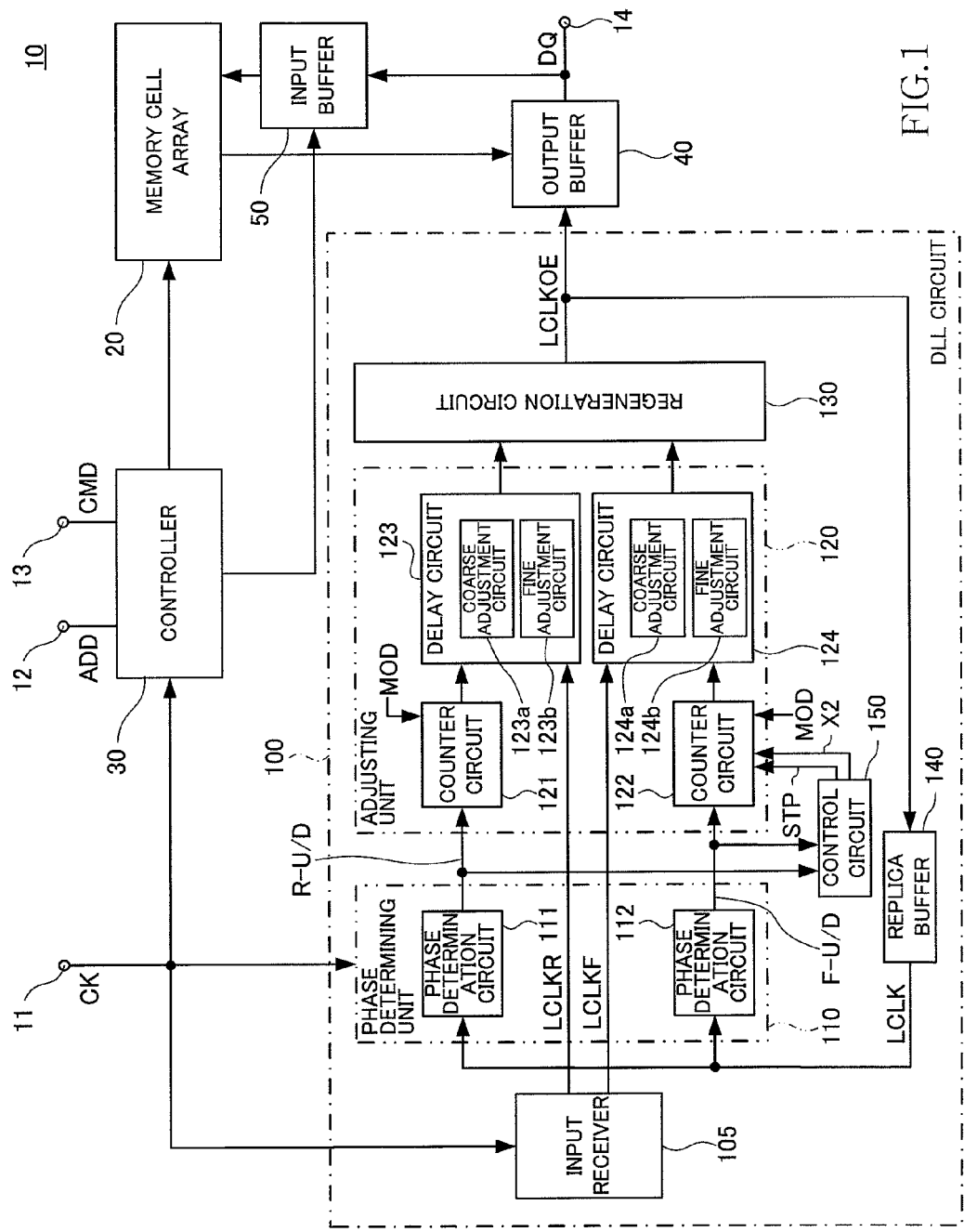
FIG. 1 is a block diagram of a semiconductor device including a DLL circuit according to an embodiment of the present invention.

FIG. 1 is a block diagram of a semiconductor device including a DLL circuit according to an embodiment of the present invention. FIG. 1 shows an example of incorporating the DLL circuit in a DRAM provided in a data processing system such as a personal computer.

A semiconductor device 10 shown in FIG. 1 includes a memory cell array 20, a controller 30 that controls access to the memory cell array 20, an output buffer 40 that outputs data read from the memory cell array 20 to outside, an input buffer 50 that temporarily stores data input from the outside, and a DLL circuit 100 that synchronizes an output timing of data from the output buffer 40 with an external clock CK.

In the semiconductor device 10, there are arranged at least a clock terminal 11, an address terminal 12, a command terminal 13, and a data input/output terminal 14, as external terminals. The clock terminal 11 is input with the external clock CK. The input external clock CK is supplied to the controller 30 and the DLL circuit 100. The address terminal 12 and the command terminal 13 are input with an address signal ADD and a command signal CMD, respectively, and the address signal ADD and the command signal CMD are supplied to the controller 30.

When the command signal CMD indicates a read operation, the controller 30 accesses data stored in an address designated by the address signal ADD among data stored in the memory cell array 20, and supplies the data to the output buffer 40. Read data DQ supplied to the output buffer 40 is output from the data input/output terminal 14 synchronously with the external clock CK under the control of the DLL circuit 100. On the other hand, when the command signal CMD indicates a write operation, the write data DQ input to the data input/output terminal 14 is fetched via the input buffer 50 and is written into an address designated by the address signal ADD in the memory cell array 20.

These operations are performed by the controller 30 synchronously with various internal clocks (not shown) generated based on the external clock CK.

A circuit configuration of the DLL circuit 100 is explained next.

As shown in FIG. 1, the DLL circuit 100 according to the present embodiment includes an input receiver 105 that generates an internal clock LCLKR (rise clock) and an internal clock LCLKF (fall clock) based on the external clock CK, a phase determining unit 110 that generates determination signals R-U/D and F-U/D by comparing phases of the external clock CK and an internal clock LCLK, an adjusting unit 120 that adjusts positions of active edges (rising edges) of the internal clocks LCLKR and LCLKF based on the determination signals R-U/D and F-U/D, a regeneration circuit 130 that generates an internal clock LCLKOE based on the internal clocks LCLKR and LCLKF, a replica buffer 140 that generates the internal clock LCLK by delaying the internal clock LCLKOE, and a control circuit 150 that changes an adjusting operation of the adjusting unit 120 according to need. In the present specification, the regeneration circuit 130 and the replica buffer 140 can be collectively called "clock generating circuit".

The phase determining unit 110 is configured by phase determination circuits 111 and 112.

The phase determination circuit 111 compares phases of a rising edge of the external clock CK and a rising edge of the internal clock LCLK, thereby generating the determination signal R-U/D. Specifically, when the rising edge of the internal clock LCLK is delayed relative to the rising edge of the external clock CK, the determination signal R-U/D is set to a low level, whereas when the rising edge of the internal clock LCLK is advanced relative to the rising edge of the external clock CK, the determination signal R-U/D is set to a high level.

The phase determination circuit 112 compares phases of a falling edge of the external clock CK and a falling edge of the internal clock LCLK, thereby generating the determination signal F-U/D. Specifically, when the falling edge of the internal clock LCLK is delayed relative to the falling edge of the external clock CK, the determination signal F-U/D is set to a low level, whereas when the falling edge of the internal clock LCLK is advanced relative to the falling edge of the external clock CK, the determination signal F-U/D is set to a high level.

Preferably, the phase determination circuit 112 compares phases of the falling edge of the external clock CK and the falling edge of the internal clock LCLK by detecting the duty of the internal clock LCLK. This circuit is called a DCC circuit (duty correction circuit). The DCC circuit does not directly compare the falling edges of both clocks but indirectly compares the falling edges of both clocks based on the duty of the internal clock LCLK. Specifically, the DCC circuit detects a difference between a period when the internal clock LCLK is at a high level and a period when the internal clock LCLK is at a low level, within a predetermined detection cycle based on the rising edge of the internal clock LCLK. The DCC circuit specifies a position of the falling edge of the internal clock LCLK based on the detected difference. As described above, a phase comparison of the falling edge by the phase determination circuit 112 does not need to be a direct comparison between the phases of the falling edge of the external clock CK and the falling edge of the internal clock LCLK. When the phase determination circuit 112 is configured by the DCC circuit, the determination signal F-U/D obtained as a result of the detection shows a direction that the duty approaches to 50%.

The adjusting unit 120 includes a counter circuit 121 of which a count value is updated based on the determination signal R-U/D, a counter circuit 122 of which a count value is updated based on the determination signal F-U/D, a delay circuit 123 delaying the internal clock LCLKR generated by the input receiver 105 based on the count value of the counter circuit 121, and a delay circuit 124 delaying the internal clock LCLKF generated by the input receiver 105 based on the count value of the counter circuit 122. In the present specification, the counter circuit 121 or 122 and the delay circuit 123 or 124 can be collectively called "adjustment circuit".

The counter circuits 121 and 122 count down when the corresponding determination signal R-U/D or F-U/D is at a low level, and count up when the corresponding determination signal is at a high level. The greater the count values of the corresponding counter circuits 121 and 122, the more the delay circuits 123 and 124 increase a delay amount of the corresponding internal clocks LCLKR and LCLKF. In the present embodiment, the delay circuit 123 includes a coarse adjustment circuit 123a having a relatively large adjusting range, and a fine adjustment circuit 123b having a relatively small adjusting range. The delay circuit 124 includes a coarse adjustment circuit 124a having a relatively large adjusting range, and a fine adjustment circuit 124b having a relatively small adjusting range.

The coarse adjustment circuits 123a and 124a are used to perform a rough adjustment in a period during which the DLL circuit 100 is not locked, such as a time immediately after supplying power to the semiconductor device 10. Thereafter, a fine adjustment is performed by using the fine adjustment circuits 123b and 124b, which brings the DLL circuit 100 into a locked state.

The regeneration circuit 130 generates the internal clock LCLKOE based on the internal clocks LCLKR and LCLKF that are adjusted by the adjusting unit 120. Specifically, the rising edge of the internal clock LCLKR is set to the rising edge of the internal clock LCLKOE, and the rising edge of the internal clock LCLKF is set to the falling edge of the internal clock LCLKOE. The internal clock LCLKOE generated by the regeneration circuit 130 is input to the output buffer 40 and the replica buffer 140.

The output buffer 40 outputs the read data DQ supplied from the memory cell array 20 from the data input/output terminal 14 synchronously with the internal clock LCLKOE. Accordingly, the read data DQ is output from the data input/output terminal 14 synchronously with the external clock CK. In other words, the internal clock LCLKOE defines an operational timing of the output buffer 40 to output the read data DQ to the outside.

On the other hand, the replica buffer 140 has a circuit configuration substantially the same as that of the output buffer 40, and generates the internal clock LCLK by adding an operation delay by the output buffer 40 to the internal clock LCLKOE. As a result, the internal clock LCLK generated by the replica buffer 140 becomes a signal completely synchronized with the read data DQ.

The control circuit 150 increases an adjustment pitch of the counter circuit 122 to double, in response to a fact that an adjustment direction of the active edge of the internal clock LCLKR based on the determination signal R-U/D and an adjustment direction of the active edge of the internal clock LCLKF based on the determination signal F-U/D are mutually the same, and temporarily stops the operation of the counter circuit 122, in response to a fact that an adjustment direction of the active edge of the internal clock LCLKR based on the determination signal R-U/D and an adjustment direction of the active edge of the internal clock LCLKF based on the determination signal F-U/D are mutually opposite. Therefore, when the adjustment directions of the internal clocks LCLKR and LCLKF are mutually the same, the counter circuit 122 counts up or counts down at a rate of two times. When the adjustment directions of the internal clocks LCLKR and LCLKF are mutually opposite, only the counter circuit 121 updates a count value, and a count value of the counter circuit 122 is fixed.

When the control circuit 150 detects that an adjustment direction of the active edge of the internal clock LCLKR based on the determination signal R-U/D and an adjustment direction of the active edge of the internal clock LCLKF based on the determination signal F-U/D are mutually the same, the control circuit 150 activates a pitch enlargement signal X2. When the control circuit 150 detects that an adjustment direction of the active edge of the internal clock LCLKR based on the determination signal R-U/D and an adjustment direction of the active edge Of the internal clock LCLKF based on the determination signal F-U/D are mutually opposite, the control circuit 150 activates a stop signal STP. The pitch enlargement signal X2 and the stop signal STP are supplied to the counter circuit 122.

Figure 2:
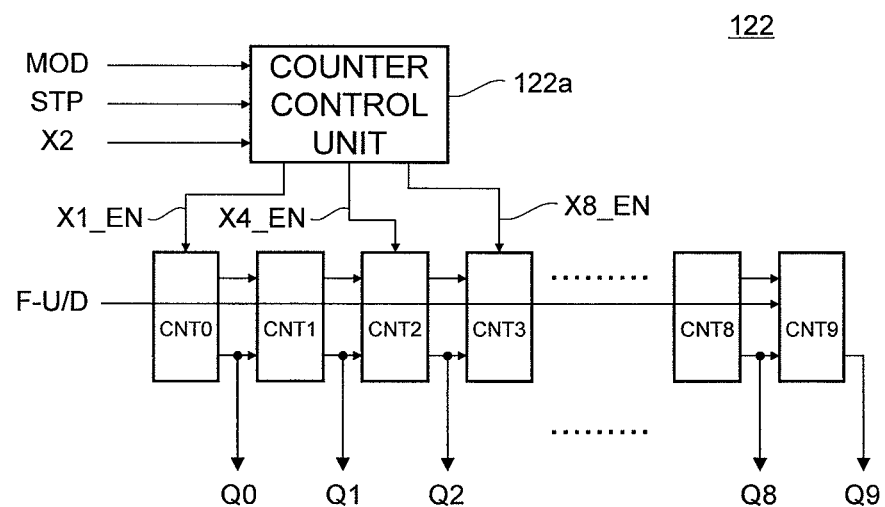
FIG. 2 is a block diagram showing a configuration of the counter circuit.

FIG. 2 is a block diagram showing a configuration of the counter circuit 122.

As shown in FIG. 2, the counter circuit 122 includes ten count-bit circuits ONT0 to CNT9 that receive the determination signal F-U/D, and a counter control unit 122a that selects a count pitch. The count bit circuits ONTO to CNT9 constitute a ten-bit binary counter, and their outputs are used as bits Q0 to Q9 constituting count values. In the present example, low-order two bits Q0 and Q1 are used to control the fine adjustment circuit 124b, and high-order eight bits Q2 to Q9 are used to control the coarse adjustment circuit 124a.

The counter control unit 122a is a circuit that receives the pitch enlargement signal X2, the stop signal STP, and a mode signal MOD supplied from the control circuit 150, and activates any one of control signals X1_EN, X4_EN, and X8_EN, based on the received signals. The mode signal MOD is also supplied to the counter circuit 121.

The mode signal MOD selects whether a delay adjustment is to be performed by the coarse adjustment circuit 124a or a delay adjustment is to be performed by the fine adjustment circuit 124b. During a period when the DLL circuit 100 is not locked, such as a time immediately after power is supplied to the semiconductor device 10, the delay adjustment by the coarse adjustment circuit 124a is selected. After a coarse delay adjustment by the coarse adjustment circuit 124a is completed, the delay adjustment by the fine adjustment circuit 124b is selected.

When the mode signal MOD selects a delay adjustment by the fine adjustment circuit 124b, the counter control unit 122a activates the control signal X1_EN. As a result, the ten-bit binary counter including the count bit circuits ONT0 to CNT9 counts up or counts down at a minimum pitch (one pitch). This adjustment pitch is a minimum adjustment pitch in the fine adjusting operation.

As described above, the pitch enlargement signal X2 is activated when an adjustment direction of the active edge of the internal clock LCLKR based on the determination signal R-U/D and an adjustment direction of the active edge of the internal clock LCLKF based on the determination signal F-U/D are mutually the same.

The counter control unit 122a activates the control signal X4_EN when the pitch enlargement signal X2 is in an inactive state and also when the mode signal MOD selects a delay adjustment by the coarse adjustment circuit 124a. As a result, the ten-bit binary counter including the count bit circuits ONT0 to CNT9 counts up or counts down at a pitch of four times of the minimum pitch (four pitches). This adjustment pitch is a minimum adjustment pitch in a coarse adjusting operation. On the other hand, the counter control unit 122a activates the control signal X8_EN when the pitch enlargement signal X2 is in an active state and also when the mode signal MOD selects a delay adjustment by the coarse adjustment circuit 124a. As a result, the ten-bit binary counter including the count bit circuits ONT0 to CNT9 counts up or counts down at a pitch of eight times of the minimum pitch (eight pitches). That is, an account value is updated at a pitch of two times of the minimum adjustment pitch in the coarse adjusting operation. When the mode signal MOD selects a delay adjustment by the fine adjustment circuit 124b, the pitch enlargement signal X2 is disregarded.

As described above, the stop signal STP is activated when an adjustment direction of the active edge of the internal clock LCLKR based on the determination signal R-U/D and an adjustment direction of the active edge of the internal clock LCLKF based on the determination signal F-U/D are mutually opposite.

The counter control unit 122a deactivates all of the control signals X1_EN, X4_EN, and X8_EN when the stop signal STP is in an active state and also when the mode signal MOD selects a delay adjustment by the coarse adjustment circuit 124a. As a result, the ten-bit binary counter including the count bit circuits ONT0 to CNT9 is prohibited from performing a counting operation. When the mode signal MOD selects a delay adjustment by the fine adjustment circuit 124b, the stop signal STP is disregarded.

The configuration of the semiconductor device 10 is as explained above. An operation of the semiconductor device 10 is explained next.

Figure 3:
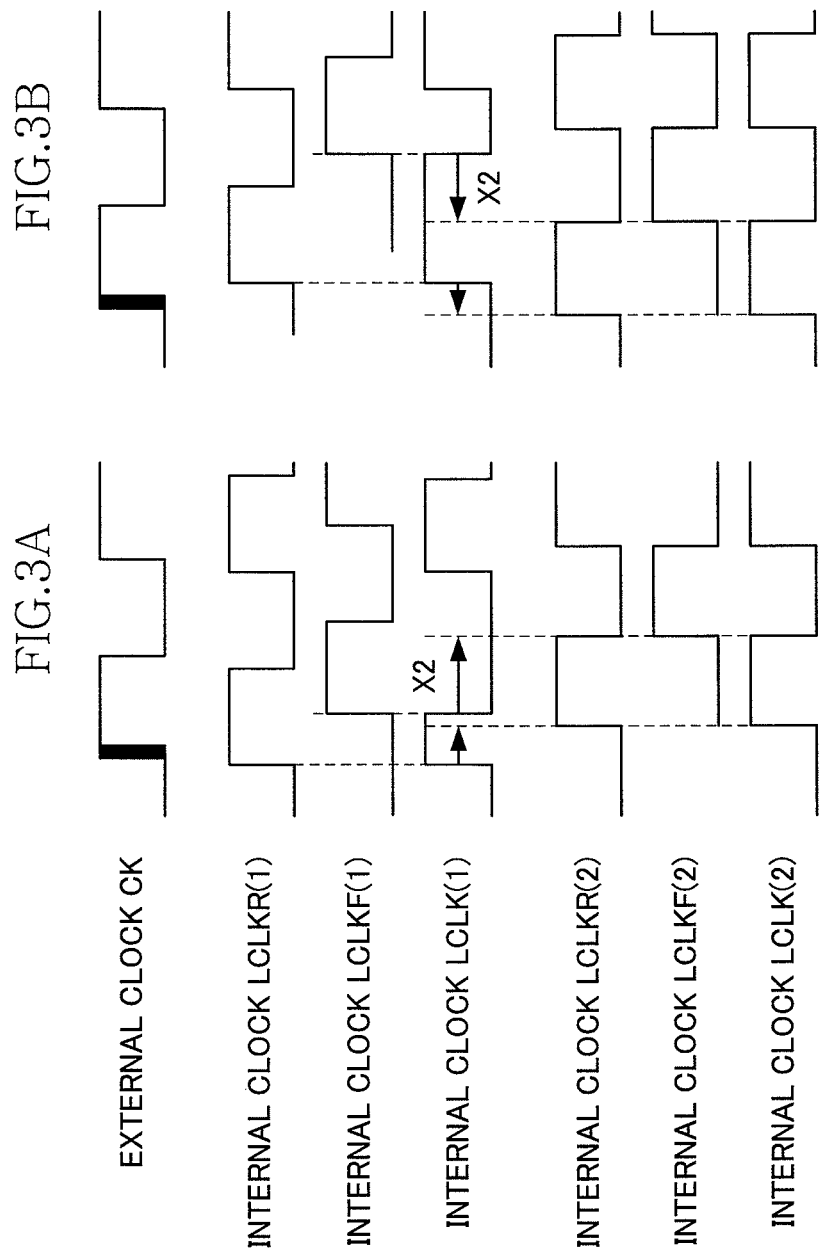
FIGS. 3A and 3B are timing diagrams for explaining the coarse adjusting operation of the DLL circuit when the adjustment directions of the internal clocks are mutually the same.
Figure 4:
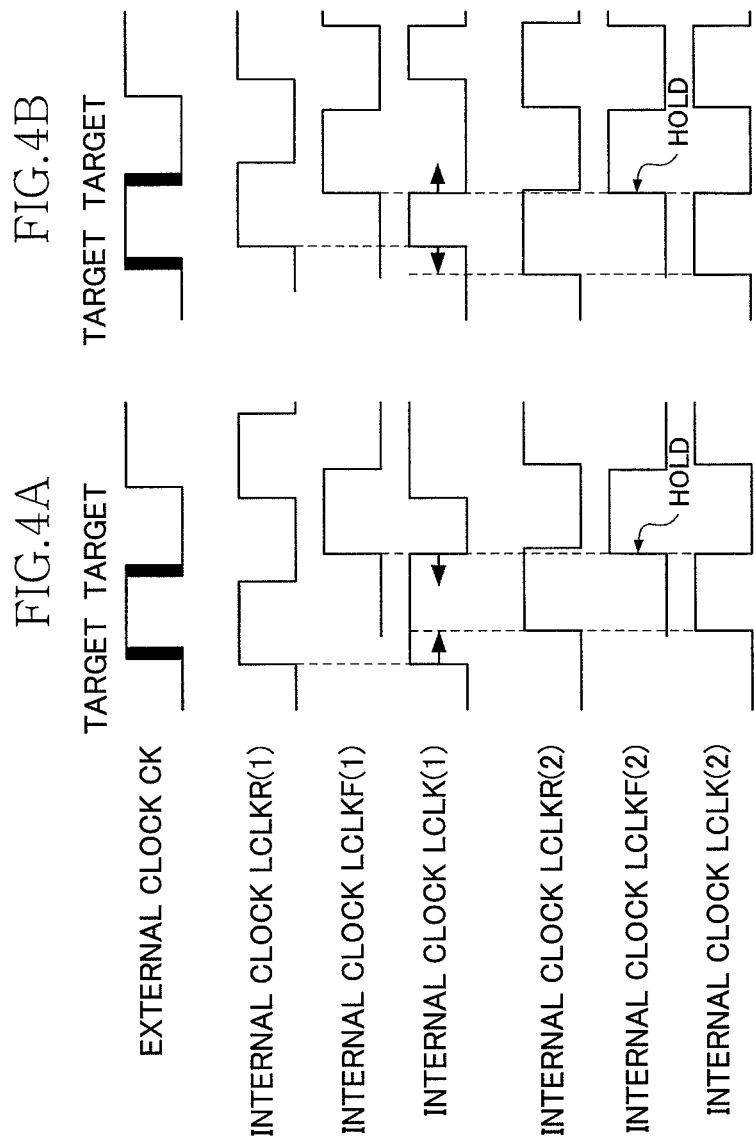
FIGS. 4A and 4B are timing diagrams for explaining a coarse adjusting operation of the DLL circuit when the adjustment directions of the internal clocks LCLKR and LCLKF are mutually opposite.
Figure 5:
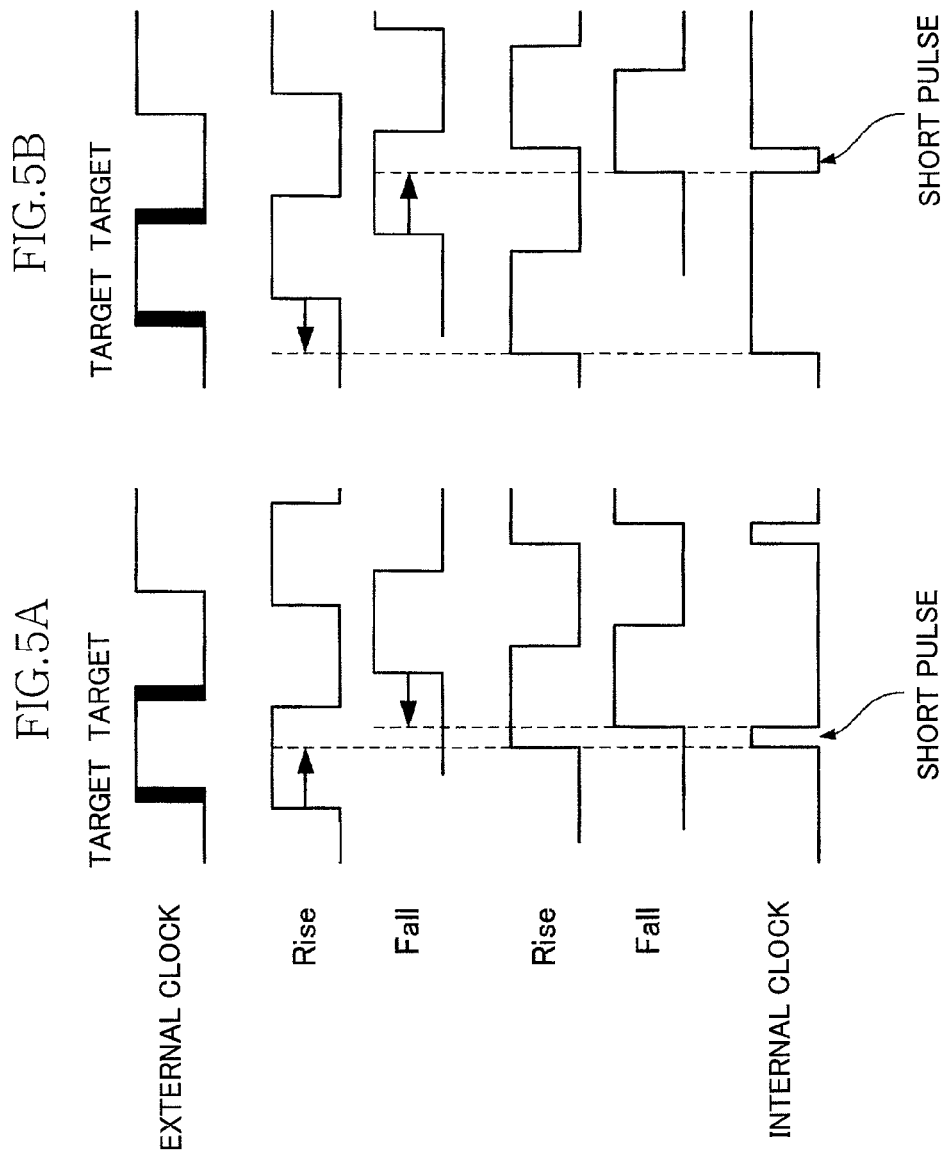
FIGS. 5A and 5B are timing diagrams for explaining a problem that arises when the operation of the counter circuit is not stopped.

FIGS. 3A and 3B are timing diagrams for explaining the coarse adjusting operation of the DLL circuit 100 when the adjustment directions of the internal clocks LCLKR and LCLKF are mutually the same. In FIGS. 3A and 3B, signals marked with (1) indicate internal clocks before the adjustment, and signals marked with (2) indicate internal clocks after the adjustment (the same applies to FIG. 4 and FIGS. 5). The coarse adjusting operation is an operation of adjusting a delay amount by using the coarse adjustment circuits 123a and 124a. That is, the mode signal MOD selects a delay adjustment by the coarse adjustment circuit 124a.

In an example shown in FIG. 3A, the rising edge of the internal clock LCLK before the adjustment is advanced compared to the rising edge of the external clock CK. Accordingly, the determination signal R-U/D is at a high level, and controls the counter circuit 121 to delay the phase of the internal clock LCLKR. The falling edge of the internal clock LCLK before the adjustment is also advanced compared to the falling edge of the external clock CK. Accordingly, the determination signal F-U/D is also at a high level, and controls the counter circuit 122 to delay the phase of the internal clock LCLKF.

Therefore, both the counter circuits 121 and 122 having received these determination signals count up, and delay the phases of the internal clock LCLKR and the internal clock LCLKF. Because the adjustment directions of the internal clocks LCLKR and LCLKF are mutually the same, the control circuit 150 activates the pitch enlargement signal X2. Accordingly, the control signal X8_EN is activated within the counter circuit 122, and counting up is performed at a pitch (eight pitches) which is double of a normal adjustment pitch (four pitches) in the coarse adjusting operation. In the counter circuit 121, counting up is performed at the normal adjustment pitch (four pitches).

On the other hand, in the example shown in FIG. 3B, the rising edge of the internal clock LCLK before the adjustment is delayed compared to the rising edge of the external clock CK. Accordingly, the determination signal R-U/D is at a low level, and controls the counter circuit 121 to advance the phase of the internal clock LCLKR. The falling edge of the internal clock LCLK before the adjustment is also delayed compared to the rising edge of the external clock CK. Accordingly, the determination signal F-U/D also becomes at a low level, and controls the counter circuit 122 to advance the phase of the internal clock LCLKF.

Accordingly, both the counter circuits 121 and 122 having received these determination signals count down, and advance the phases of the internal clock LCLKR and the internal clock LCLKF. Because the adjustment directions of the internal clocks LCLKR and LCLKF are mutually the same, the control circuit 150 activates the pitch enlargement signal X2. Accordingly, the control signal X8_EN is activated within the counter circuit 122, and counting down is performed at a pitch (eight pitches) which is double of the normal adjustment pitch (four pitches) in the coarse adjusting operation. In the counter circuit 121, counting down is performed at the normal adjustment pitch (four pitches).

In this way, when the adjustment directions of the internal clocks LCLKR and LCLKF are mutually the same in the coarse adjusting operation, the counter circuit 121 updates a count value at the normal pitch (four pitches), and the counter circuit 122 updates a count value at a double pitch (eight pitches) of the normal pitch. As a result, not only the phase but also the duty of the internal clock LCLK are corrected, and approach to 50%. Particularly, when the phase determination circuit 112 is configured by the DCC circuit, the adjustment direction of the internal clock LCLKF based on the determination signal F-U/D shows a direction that the duty approaches to 50% without exception. However, when the internal clock LCLKR is adjusted to the same direction at the same pitch, the duty is not changed. On the other hand, in the present embodiment, in the above case, the adjustment amount of the internal clock LCLKF is set to two times. Therefore, both the phase and the duty of the internal clock are corrected at the same time.

FIGS. 4A and 4B are timing diagrams for explaining a coarse adjusting operation of the DLL circuit 100 when the adjustment directions of the internal clocks LCLKR and LCLKF are mutually opposite.

In an example shown in FIG. 4A, the rising edge of the internal clock LCLK before the adjustment is advanced compared to the rising edge of the external clock CK. Accordingly, the determination signal R-U/D becomes at a high level, and controls the counter circuit 121 to delay the phase of the internal clock LCLKR. On the other hand, the falling edge of the internal clock LCLK before the adjustment is delayed as compared to the falling edge of the external clock CK. Accordingly, the determination signal F-U/D becomes at a low level, and controls the counter circuit 122 to advance the phase of the internal clock LCLKF. In this way, the adjustment directions of the internal clocks LCLKR and LCLKF are mutually opposite.

Therefore, the control circuit 150 activates the stop signal STP, and temporarily stops the operation of the counter circuit 122. As a result, only counting up of the counter circuit 121 is performed, and the phase of the internal clock LCLKR is delayed by four pitches while a delay amount of the internal clock LCLKF is fixed. Accordingly, a clock width of the internal clock LCLK becomes smaller by four pitches than the clock width before the adjustment, and the clock width hardly becomes too small.

Meanwhile, in an example shown in FIG. 4B, the rising edge of the internal clock LCLK before the adjustment is delayed as compared to the rising edge of the external clock CK. Accordingly, the determination signal R-U/D becomes at a low level, and controls the counter circuit 121 to advance the phase of the internal clock LCLKR. On the other hand, the falling edge of the internal clock LCLK before the adjustment is advanced as compared to the falling edge of the external clock CK. Accordingly, the determination signal F-U/D becomes at a high level, and controls the counter circuit 122 to delay the phase of the internal clock LCLKF. In this way, the adjustment directions of the internal clocks LCLKR and LCLKF are mutually opposite.

Therefore, the control circuit 150 activates the stop signal STP, and temporarily stops the operation of the counter circuit 122. As a result, only counting down of the counter circuit 121 is performed, and the phase of the internal clock LCLKR is advanced by four pitches while the delay amount of the internal clock LCLKF is fixed. Accordingly, a clock width of the internal clock LCLK becomes larger by four pitches than the clock width before the adjustment, and the clock width hardly becomes too large.

A problem that arises when the operation of the counter circuit 122 is not stopped is explained in more detail.

In an example shown in FIG. 5A, like in the example shown in FIG. 4A, the rising edge of the internal clock LCLK before the adjustment is advanced, and also the falling edge of the internal clock LCLK before the adjustment is delayed. When both counting up of the counter circuit 121 and counting down of the counter circuit 122 are performed in this state, a generated clock width of the internal clock LCLK becomes too small. That is, the clock width of the internal clock becomes smaller by eight pitches than the clock width before the adjustment. This phenomenon does not become a serious problem when a clock cycle for a one-time adjustment pitch is sufficiently long. However, when a frequency of the external clock is high, and also when a clock width of the internal clock becomes small by eight pitches at a time, the clock width becomes too small, and this has a risk of pulse loss in some cases.

This problem also occurs in a case opposite to the above example. In an example shown in FIG. 5B, like in the example shown in FIG. 4B, the rising edge of the internal clock LCLK before the adjustment is delayed, and also the falling edge of the internal clock LCLK before the adjustment is advanced. When both counting down of the counter circuit 121 and counting up of the counter circuit 122 are performed in this, state, a generated clock width of the internal clock LCLK becomes too large. Therefore, a pulse at a low side becomes a short pulse, and has a risk of pulse loss in some cases.

As described above, when both the counter circuits 121 and 122 are updated in the opposite direction when the frequency of the external clock is high, a pulse of the internal clock has a risk of pulse loss. When the pulse loss occurs, the DLL circuit cannot operate anymore, and the system must be reset.

However, in the DLL circuit 100 according to the present embodiment, the counter circuits 121 and 122 are not updated in the opposite direction in the coarse adjusting operation. Therefore, even when the frequency of the external clock is high, the pulse of the internal clock is hardly lost.

As explained above, according to the semiconductor device 10, at the time of updating the counter circuits 121 and 122 in the same direction in the coarse adjusting operation, a count value of the counter circuit 122 is updated at a pitch of two times of that of the counter circuit 121. Therefore, the duty can be corrected while performing phase control. Accordingly, the time required to correct the duty can be shortened, and the DLL circuit can be locked at a high speed. Because the counter circuits 121 and 122 are not updated in an opposite direction in the coarse adjusting operation, the clock width of the internal clock LCLK can be prevented from becoming too large or too small.

Figure 6:
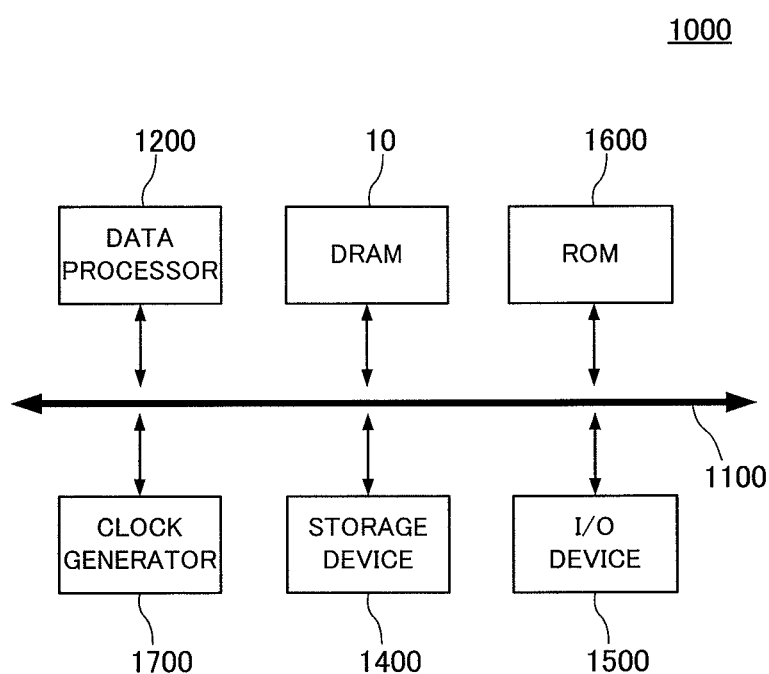
FIG. 6 is a block diagram showing a configuration of a data processing system using the semiconductor device.

FIG. 6 is a block diagram showing a configuration of a data processing system 1000 using the semiconductor device and shows a case that the semiconductor device is a DRAM.

The data processing system 1000 shown in FIG. 6 has a configuration such that a data processor 1200 and a semiconductor device (DRAM) 10 according to the present embodiment are mutually connected via a system bus 1100. Examples of the data processor 1200 include, but are not limited to, a microprocessor (MPU) and a digital signal processor (DSP). In FIG. 6, for the sake of simplification, the data processor 1200 and the DRAM 1300 are connected via the system bus 1100. However, these components can be connected by a local bus rather than being connected via the system bus 1100.

In FIG. 6, for the sake of simplification, only one set of system bus 1100 is shown. However, the system buses 1100 can be arranged via a connector or the like in series or in parallel according to need. In the memory-system data processing system shown in FIG. 6, while a storage device 1400, an I/O device 1500, a ROM 1600, and a clock generator 1700 are connected to the system bus 1100, these are not necessarily essential constituent elements. The clock generator 1700 generates the external clock CK. The external clock CK is supplied to each devices including DRAM 10 as a system clock of the data processing system 1000.

Examples of the storage device 1400 include a hard disk drive, an optical disk drive, and a flash memory. Examples of the I/O device 1500 include a display device such as a liquid crystal display, and an input device such as a keyboard and a mouse. Regarding the I/O device 1500, it is only necessary to provide either one of the input device or the output device. Further, for the sake of simplicity, each constituent element shown in FIG. 6 is shown one each. However, the number is not limited to one, and a plurality of one or two or more constituent elements can be provided.

It is apparent that the present invention is not limited to the above embodiments, but may be modified and changed without departing from the scope and spirit of the invention.

For example, in the above embodiment, when the adjustment directions of the internal clocks LCLKR and LCLKF are mutually the same, a count value in the counter circuit 121 is updated at the normal pitch, and a count value in the counter circuit 122 is updated at a pitch of two times of the normal pitch. Alternatively, a count value in the counter circuit 122 can be updated at the normal pitch, and a count value in the counter circuit 121 can be updated at a pitch of two times of the normal pitch. However, when the DCC circuit is used for the phase determination circuit 112, duty detection is performed based on the rising edge of the internal clock LCLK as described above. Therefore, preferably, phase control is performed at the normal pitch for the falling edge of the internal clock LCLK. Considering this point, preferably, a count pitch of the counter circuit 122 is enlarged as done in the above embodiment.

Enlargement of the adjustment pitch does not need to be two times of the normal pitch, and can be smaller or larger than this. Instead of enlarging the adjustment pitch of one counter circuit, the adjustment pitch of one counter circuit can be shortened. However, in this case, it takes more time to lock the DLL circuit than the time required in the above embodiment. Therefore, preferably, the adjustment pitch of one counter circuit is set to the normal pitch, and the adjustment pitch of the other counter circuit is set higher than the normal pitch (preferably, two times), like in the above embodiment. Two times is preferable because the counter circuit is in a binary format in most cases.

Furthermore, in the above embodiment, when the adjustment directions of the internal clocks LCLKR and LCLKF are mutually opposite, the control circuit 150 stops the operation of the counter circuit 122. Alternatively, an operation of the counter circuit 121 can be stopped instead of the counter circuit 122. However, for the phase determination circuit 112 that detects the falling edge of the internal clock LCLK, the DCC circuit is often used as described above. Because the DCC circuit uses the rising edge of the internal clock LCLK, when the operation of the counter circuit 121 stops, the operation of the DCC circuit is fluctuated. Considering this point, preferably, the operation of the counter circuit 122 is stopped by the control circuit 150 as done in the above embodiment.

The stop operation performed by the control circuit 150 can be set by a command input from outside. According to this configuration, when the counter circuit 122 does not need to be stopped by the control circuit 150 like when the frequency of the external clock CK is low, the lock time of the DLL circuit 100 can be shortened.

Further, in the present invention, even when the adjustment directions of the internal clocks LCLKR and LCLKF are mutually opposite in the coarse adjusting operation, it is not essential for the control circuit 150 to stop the counter circuit 122. That is, the counter circuits 121 and 122 can be updated in the opposite direction in the coarse adjusting operation.

What is claimed is:

1. A semiconductor device, comprising:
   an external terminal which receives an external clock;
   a first phase determination circuit configured to receive the external clock and an internal clock to generate a first determination signal based on a phase between a first edge of the external clock and a first edge of the internal clock, the first edge is one of a rising edge and a falling edge;
   a second phase determination circuit configured to receive the external clock and the internal clock to generate a second determination signal based on a phase between a second edge of the external clock and a second edge of the internal clock, the second edge is the other of the rising edge and the falling edge;
   a control circuit configured to receive the first and second determination signals and output a pitch enlargement signal based on the first and second determination signals; and
   a counter circuit configured to output a count value produced, by counting up or counting down based on the second determination signal, by a first pitch when the pitch enlargement signal indicates a first state, and by a second pitch larger than the first pitch when the pitch enlargement signal indicates a second state.

2. The semiconductor device, as claimed in claim 1, further comprising:
   a second counter circuit configured to output a second count value produced by counting up or counting down based on the first determination signal.

3. The semiconductor device, as claimed in claim 2, further comprising:
   a regeneration circuit configured to produce a first clock signal based on outputs from the counter circuit and the second counter circuit.

4. The semiconductor device, as claimed in claim 3, further comprising:
   a replica buffer configured to produce the internal clock based on the first clock signal.

5. The semiconductor device as claimed in claim 2, wherein the control circuit outputs the pitch enlargement signal indicating the second state in response to a fact that an adjustment direction of the first edge of the internal clock and an adjustment direction of the second edge of the internal clock are mutually same.

6. The semiconductor device as claimed in claim 5, wherein the second pitch is two times larger than the first pitch.

7. The semiconductor device as claimed in claim 1, wherein the counter circuit receives a mode signal, so that the counter circuit counts up or down by the first or second pitches when the mode signal indicates a first mode, and counts up or down by a third pitch smaller than the first pitch when the mode signal indicates a second mode.

* * * * *